United States Patent
Balooch et al.

(10) Patent No.: US 7,118,630 B1
(45) Date of Patent: Oct. 10, 2006

(54) APPARATUS FOR DEPOSITING A LOW WORK FUNCTION MATERIAL

(75) Inventors: Mehdi Balooch, Berkeley, CA (US); Long N. Dinh, Concord, CA (US); Wigbert J. Siekhaus, Berkeley, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 09/636,134

(22) Filed: Aug. 10, 2000

Related U.S. Application Data

(62) Division of application No. 09/080,109, filed on May 18, 1998, now Pat. No. 6,120,857.

(51) Int. Cl.
*C23C 16/00* (2006.01)

(52) U.S. Cl. .......... 118/726; 427/596; 427/597
(58) Field of Classification Search .......... 118/722, 118/723 HC, 726; 427/596, 597
See application file for complete search history.

(56) References Cited

U.S. PATENT DOCUMENTS

| | | | | |
|---|---|---|---|---|
| 5,242,706 A | * | 9/1993 | Cotell | 427/596 |
| 5,254,832 A | * | 10/1993 | Gartner | 427/596 |
| 5,389,606 A | * | 2/1995 | Face | 427/596 |
| 5,432,151 A | * | 7/1995 | Russo et al. | 505/474 |
| 5,672,210 A | * | 9/1997 | Moto et al. | 118/726 |
| 5,866,975 A | * | 2/1999 | Gärtner | 313/346 DC |
| 5,897,790 A | * | 4/1999 | Koga | 216/11 |
| 6,007,399 A | * | 12/1999 | Mehrotra | 445/50 |
| 6,090,207 A | * | 7/2000 | Knauss et al. | 118/715 |

OTHER PUBLICATIONS

Chrisey et al., "Pulsed Laser Deposition of Thin Films," John Wiley & Sons, NY, pp. 42, 43, 294, 456, Jun. 1994.*
Keenan, General College Chemistry, Harper and Rowe, New York, 1957, p. 432.*
Webster's New Collegiate Dictionary, G & C Merriam Co., p. 1080, 1975.*
Chrisey et al, Pulsed Laser Deposition of Thin Films, John Wiley & Sons, N.Y., pp 42–43, 294, 456 & 262–263, 1994.*

* cited by examiner

*Primary Examiner*—Richard Bueker
(74) *Attorney, Agent, or Firm*—James S. Tak; L. E. Carnahan

(57) ABSTRACT

Short-wavelength photons are used to ablate material from a low work function target onto a suitable substrate. The short-wavelength photons are at or below visible wavelength. The elemental composition of the deposit is controlled by the composition of the target and the gaseous environment in which the ablation process is performed. The process is carried out in a deposition chamber to which a short-wavelength laser is mounted and which includes a substrate holder which can be rotated, tilted, heated, or cooled. The target material is mounted onto a holder that spins the target during laser ablation. In addition, the deposition chamber is provided with a vacuum pump, an external gas supply with atomizer and radical generator, a gas generator for producing a flow of molecules on the substrate, and a substrate cleaning device, such as an ion gun. The substrate can be rotated and tilted, for example, whereby only the tip of an emitter can be coated with a low work function material.

9 Claims, 1 Drawing Sheet

APPARATUS FOR DEPOSITING A LOW WORK FUNCTION MATERIAL

This is a division application Ser. No. 09/080,109, filed May 18, 1998, now U.S. Pat. No. 6,120,857.

The United States Government has rights in this invention pursuant to Contract No. W-7405-ENG-48 between the United States Department of Energy and the University of California for the operation of Lawrence Livermore National Laboratory.

BACKGROUND OF THE INVENTION

The present invention relates to forming low work function layers, particularly to producing low work function surface layers on a substrate, and more particularly to a process and apparatus for forming low work function surface layers by laser ablation using short-wavelength photons.

Electron emission from sharp tips due to an applied electric field is an important phenomenon in many technical applications, such as scanning tunneling microscopy and flat panel display technology. In all such applications and, in particular, the two-referenced above, it is important that the tips have low work functions, are smooth on the nanometer scale, and are stable in varying gaseous environments and under high electric field conditions.

It is well known that alkali metal oxides or alkali-metal-silicon oxides on elemental or oxide substrates, show low work functions (~1 eV) (see *Handbook of Thermionic Properties* by V. S. Fomenko, G. V. Samsonov ed., Plenum Press Data Division, New York, 1966). Layers of such materials have been applied in the prior art as pastes to be "activated" by various procedures. However, such activation procedures cannot be used for micro-meter-scale protrusions, for example, to be used as field-emitter tips.

It has been found that laser ablation can be performed on targets of arbitrary composition, even on materials of extremely high melting point, such as thorium oxide, and the deposition process is directly in line of sight from the laser impact point so that complicated structures, such as field emitter structures, can be coated at desired locations. Based on these findings, the present invention has been developed which involves a process and apparatus for producing low work function surface layers on substrates by laser ablation using short-wavelength (at or below visible wavelength) photons from low work function targets. The elemental composition of the deposited layer is controlled by the composition of the target and the gaseous environment in which the ablation process is performed.

SUMMARY OF THE INVENTION

It is an object of the present invention to provide surface layers of low work function material.

A further object is to provide a method and apparatus for depositing low work function material on a substrate.

A further object of the invention is to provide low work function surface layers by laser ablation.

Another object of the invention is to provide a process and apparatus for producing low work function surface layers by laser ablation using short-wavelength photons.

Another object of the invention is to provide a process and apparatus for depositing low work function material wherein the elemental composition of the deposit is controlled.

Another object of the invention is to provide a process for depositing low work function material on a substrate and controlling the composition of the deposited material by the composition of a laser ablated target and the gaseous environment in which the ablation is performed.

Another object of the invention is to provide sharp tips utilized in electron emission devices with a material having low work functions, and is stable in varying gaseous environments and under high electrical field conditions.

Other objects and advantages of the present invention will become apparent from the following description and accompanying drawings. The invention involves depositing low work function surface layers by laser ablation using short-wavelength photons. The short-wavelength photons are at or below visible wavelength. The elemental composition of the deposited low work function material is controlled by the composition of the laser ablated target, the temperature of the substrate, and the gaseous environment in which the ablation process is performed. The target material is mounted at an angle on a rotatable holder and the substrate on which the deposit is to be made is mounted on a holder that can be rotated, tilted, heated, and cooled. The apparatus may also include an ion gun for surface cleaning of the substrate, a gas generator for producing a flow of molecules directed at the substrate, and a supply of gas to control the environment which may be made reactive or changed into radicals on the way to the substrate's surface. Since the substrate can be both rotated and tilted, the ablated material from the target may contact the substrate at various angles, thus enabling, for example, the coating of a sharp tip of a field emission device with a desired low work function material. For example, a barium/$SiO_2$ glass was ablated onto a substrate using ns-long laser pulses of short-wavelength photons, and the work function of the deposited layer was found to be close to the work function of the barium metal oxide target. For example, the laser ablation may be carried out using an excimer laser or a frequency tripled NdYAG laser. The invention thus has many applications, such as coating electron-emitting surfaces (e.g., filaments, field emitters) for electron microscopes or flat panel displays; or for scanning more microscope tips to reduce work function.

BRIEF DESCRIPTION OF THE DRAWINGS

The accompanying drawings, which are incorporated into and form a part of the disclosure, illustrate an embodiment of the invention and, together with the description, serve to explain the principles of the invention.

DETAILED DESCRIPTION OF THE INVENTION

Figure 1:
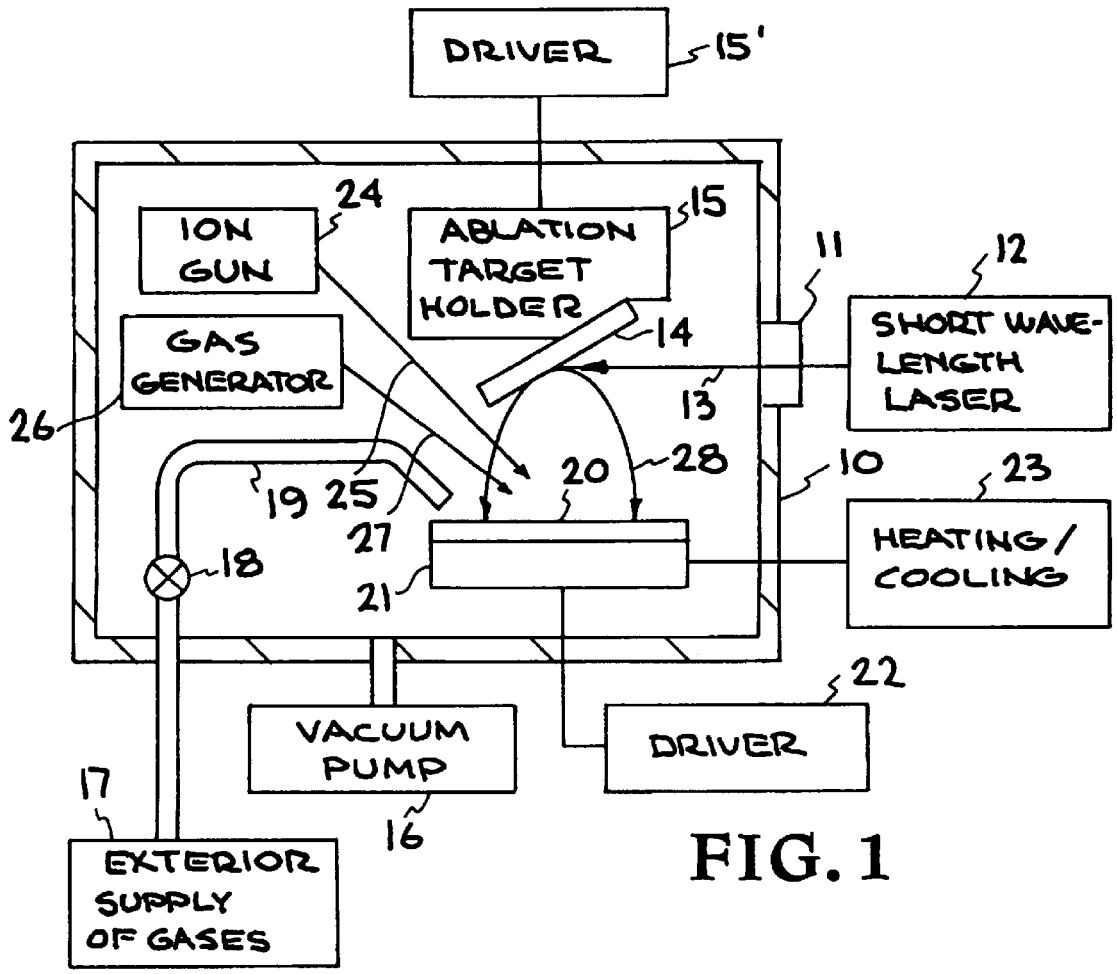
FIG. 1 schematically illustrates an embodiment of an apparatus for carrying out the process of depositing low work function surface layers by laser ablation in accordance with the present invention.

The present invention is directed to depositing low work function material on a surface by laser ablation using short-wavelength photons. The short-wavelength photons are at or below visible wavelength and thus are in the range of 200 to 550 nm. The elemental composition of the deposited low work function layer can be controlled by the composition of the laser ablated target and the gaseous environment in which the ablation process is performed. The invention is particularly applicable for use in fabricating devices using electron emission from sharp tips, such as in tunneling microscopy and flat panel display technology, wherein it is important that the tips: (1) have low work functions, (2) are smooth on a nanometer scale, and (3) are stable in varying gaseous environments and under high electric field conditions. Tests have established that each of these three (3) properties has been achieved by the process and apparatus of the present invention. Since laser ablation can be performed on targets of arbitrary composition, even on materials of extremely high melting point such as thorium oxide, and since here the target is rotated and the substrate to be deposited on can be rotated, tilted, heated, and cooled; and since the deposition process is directional in line of sight from the laser impact point, the low work function material can be deposited on essentially any shaped substrate of various materials. The lasers utilized for producing the desired short-wavelength photons include excimer lasers and frequency tripled NdYAG lasers. For example, an Xe excimer laser producing pulses in the 10 to 30 ns length, and which operates at a wavelength of 308 nm with an energy fluence of 0.5 J/pulse, has been utilized to ablate a barium metal oxide target to deposit a layer of barium/$SiO_2$ glass onto a substrate, and tests established that the work function of the deposited layer was close to the work function of the barium metal oxide target.

The objective of the present invention is to create at the surface of a substrate a layer having a work function different from that of the substrate by laser-ablating a material of the desired composition onto the substrate of interest. The composition of the deposit is to be controlled by the ablation-target's composition, target's temperature, and by the composition of the environment in which the ablation process occurs. Thus, using the same target composition and changing the composition of the environment, different compositions of the deposited material may be provided.

In the particular implementation of the invention to experimentally verify the deposition process, the substrate to be surface-modified was introduced into a deposition chamber that could be evacuated to ultra high vacuum (UHV) conditions or filled with suitable gases from an exterior supply line. The target material was mounted onto a holder that spins the target during laser deposition so that subsequent pulses hit different target spots. The substrate is mounted onto a device that can heat or cool it over a wide range of temperatures, spin the substrate during a series of deposition pulses, and tilt/spin the substrate during deposition. Alternative other means (such as a laser) can be employed to change the substrate's surface temperature by delivering energy to it from the outside of the chamber. The substrate can be made to face, simultaneously or separately, a variety of devices for cleaning or processing the substrate surface, such as a Knudsen cell capable of generating a flow of molecules directed at the surface or an ion gun. Naturally occurring surface contaminations, such as the surface oxide, were removed by heating the substrate such that the contamination volatilizes or is "burned" by the introduction of a suitable reactive gas from the outside, or/and by simultaneous ion bombardment with suitable noble gas ions. Gases introduced from the outside may be made more reactive by dissociating them or changing them into radicals on their way to the substrate's surface. Surface cleanliness may be monitored in situ by instrumentation, such as an Auger Analyzer. The simultaneous use of all or some of these tools makes it possible to controllably create surface layers containing elements introduced from interior and exterior gas sources and the ablation target. Thus a wide range of surface-layer-compositions can be produced. For example, as pointed out above, a barium/$SiO_2$ glass was ablated onto a substrate and the work function of the surface layer thus deposited was measured by photoelectron spectroscopy and Kelvin Probe, and it was found to be close to the work function of the barium metal oxide target which was ablated onto the substrate.

FIG. 1 illustrates an embodiment of an apparatus which includes components that can be utilized to produce or deposit a variety of compositions of low work function material from the same target on a substrate. As shown, the FIG. 1 apparatus comprises a deposition chamber 10 having a window 11 therein through which an externally located short-wavelength laser 12 directs pulses of energy indicated at 13 onto a target 14 retained by an ablation target holder 15 located in deposition chamber 10, and which may be rotated as known in the art by drive means indicated at 15'. Located externally of and operatively connected to deposition chamber 10 is a vacuum pump 16 capable of evacuation of chamber 10 to ultra high vacuum (UHV) conditions, if desired. Also located externally is an exterior supply of gas 17 to which is connected a gas doser 18 (with atomizer and radical generator) located within deposition chamber 10 and constructed, as indicated at 19, to direct gas onto a substrate 20 on which low work function material is to be deposited. The substrate 20 is mounted to a substrate holder 21, which is connected to a driver 22 located externally of deposition chamber 10, whereby the holder 21 can be rotated, tilted, or tilted and rotated. The substrate holder 21 is also connected to means indicated generally at 23 and located externally for heating or cooling the substrate 20. Drive mechanisms for rotating a target and for rotating/tilting a substrate holder and means for heating/cooling a substrate are known in the deposition art and thus need not be herein described in detail. Located within deposition chamber 10 are an ion gun 24 for surface cleaning the substrate 20, as indicated by arrow 25, and a gas generator 26 for producing a flow of molecules on the surface of the substrate 20, as indicated by arrow 27. The ion gun 24 and gas generator 26 may be located externally of chamber 10, with openings provided in the chamber to enable treatment of the substrate thereby.

As shown in FIG. 1 and after the surface of substrate 20 has been cleaned, the composition of the environment within deposition chamber 10 has been determined and established, and with the ablation target holder 15 and substrate holder 21 rotating, pulses of laser energy 13 from short-wavelength laser 12 are directed through window 11 onto rotating target 14, whereby material is ablated from the target 14 onto the surface of substrate 20 as indicated by arrows 28, whereby a layer of low work function material from target 14 is deposited on substrate 20.

By way of example, the substrate 20 may be composed of glass, plastics, ceramics, semiconductor materials such as Si and GaAs, or metal; the target 14 may be composed of barium metal oxide or an alkali metal oxide; the exterior gas supply 17 may contain oxygen, ozone, or water vapor. The gas generator 26 may be constructed to produce molecules of oxygen, atomic oxygen, hydrogen, or alkali metal vapor. The target holder 15 may be rotated at 1 to 10 rpm, and the substrate holder 21 may be rotated at 1 to 10 rpm and tilted at an angle of 0 to 90°. The substrate holder 21 may be constructed to enable heating of the substrate 20 to up to 500° C., or cooled to liquid nitrogen temperature (77° C.). The short-wavelength laser may be an NdYAG laser or an excimer laser, with the short-wavelength being in the range of 200 to 550 nm, with the laser pulse being of a length of 6 to 60 nanoseconds, with an energy fluence of 0.2–5 J/pulse.

As a specific example, a target of barium oxide doped in $SiO_2$ (dopant level: 10→20%) was ablated by an Xe type excimer laser producing 30 ns pulses of 308 nm wavelength photons onto a silicon substrate, the substrate preparation (cleaning) and the environment conditions within the deposition chamber were as follows:

The Si substrate was first sputtered clean by an Ar ion current of 100 nA at 5 kV for 15 minutes, then flash-heated to 1000° C. The deposition chamber was initially pumped to $10^{-8}$ Torr before oxygen was leaked into the system up to $10^{-2}$ Torr. At this moment, the excimer laser beam was focused to a spot of about 0.5 mm in diameter on the barium silicon oxide target. Operating the laser with a fluence of 0.5 J/pulse at 1 Hz for 20 seconds yielded a deposition layer of about 2.5 nm on the Si substrate. The substrate to target distance was about 25 cm.

In another example of the process of the invention, a 2 nm barium-silicon-oxide layer was deposited on a Mo substrate cleaned and ablated as follows:

The Mo substrate was first sputtered clean by an Ar ion current of 100 nA at 5 kV for 15 minutes, then flash-heated to 1200° C. The deposition chamber was initially pumped to $10^{-10}$ Torr before oxygen was leaked into the system up to $10^{-3}$ Torr. Operating the laser in the 4th harmonic (266 nm) with a fluence of 0.35 J/pulse at 10 Hz for 2 seconds yielded a deposition layer of about 2 nm barium oxide on the Mo substrate. The substrate to target distance was about 30 cm.

Figure 2:
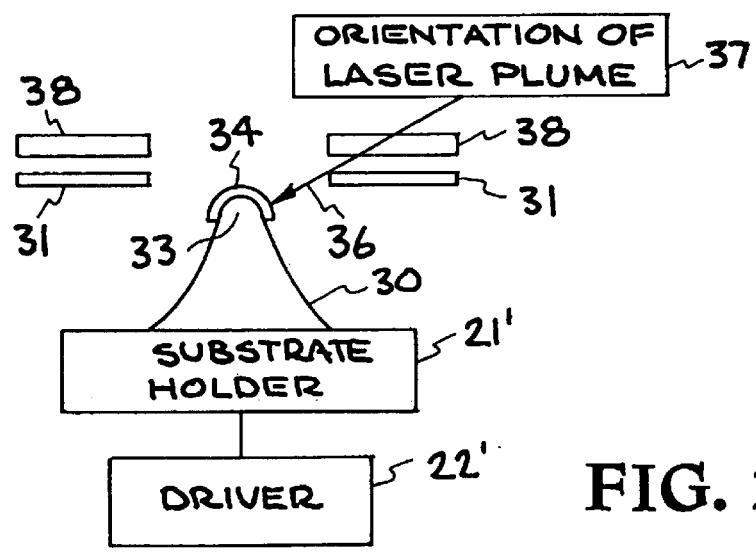
FIG. 2 schematically illustrates a portion of the apparatus of FIG. 1 for depositing a surface layer of low work function material on the tip of a field emitter structure.

As pointed out above, the apparatus and process of the invention has application for the fabrication and/or coating of electron-emitting surfaces, or modifying surfaces such that they do easily emit electrons, or coating scanning probe microscope tips to reduce work-function. FIG. 2 illustrates an example of the process for coating an electron-emitting surface utilizing the apparatus of FIG. 1. As shown in FIG. 2, a substrate (electron-emitting surface) 30 is mounted on a substrate holder 21' driven (rotated and/or tilted) by a driver mechanism 22', and a mask or barrier plate 31 having an opening 32 is positioned adjacent the tip 33 of substrate 30, whereby the tip 33 is coated at 34 with a low work function material laser ablated from a target, as indicated by arrow 36. Due to the angle or orientation of the laser plume indicated by 37, the arrow 36, the substrate 30 is tilted and rotated such that the ablated material passes thorough opening 32 in barrier or mask 31 onto tip 33 of substrate 30, whereby only the tip 33 is coated by the ablated material 36, the area of barrier 31 around opening 32, indicated at 38, prevents the body of substrate 30 from being coated.

It has thus been shown that the present invention produces low work function surface layers by laser ablation using short-wavelength photons. The composition of the surface layers of low work function material can be controlled by the composition of the laser ablated target and the gaseous environment in which the ablation process occurs. Electron-emitting surfaces (filaments, field emitters, etc.) having sharp tips, for example, can be produced wherein the tips have low work functions, and are stable in varying gaseous environments and under high electric field conditions. Thus electron-emitting devices coated by the process of the present invention find applications in scanning tunneling microscope and flat panel display technology, for example.

While a particular apparatus and particular process operations, along with materials, parameters, etc., have been described or illustrated to exemplify and teach the principals of the invention, such are not intended to be limiting. Modifications and changes may become apparent to those skilled in the art, and it is intended that the invention be limited only by the scope of the appended claims.

What is claimed is:

1. An apparatus for depositing a material having a work function of approximately 1 eV on a substrate by laser ablation using short-wavelength photons, including:

a deposition chamber, a target containing a material having a work function of approximately 1 eV in said chamber, a laser capable of directing photons at or below visible wavelength into said chamber and onto said target, means for rotating said target, means for controlling the composition of the deposit by controlling at least one of the groups consisting of the environment of said deposition chamber, the target composition, and the target temperature.

a substrate located in said chamber, means for holding said substrate, means for rotating and tilting said substrate, means for processing the surface of the substrate, and means for heating and cooling said substrate.

2. The apparatus of claim 1, additionally including means for maintaining a vacuum in said deposition chamber.

3. The apparatus of claim 1, additionally including an ion gun for surface cleaning the substrate.

4. The apparatus of claim 1, additionally including a gas generator for producing a flow of molecules on a surface of the substrate.

5. The apparatus of claim 1, wherein said deposition chamber includes a window through which the short-wavelength photons are directed.

6. The apparatus of claim 1, wherein said target is retained in a target holder and rotated at 1–10 rpm.

7. The apparatus of claim 1, wherein said means for holding said substrate is rotated at 1 to 10 rpm and tilted at an angle in a range of 0 to 90° with respect to horizontal.

8. The apparatus of claim 1, wherein said laser is selected from the group consisting of NdYAG, an excimer, and wherein said short-wavelength is in the range of 200 to 550 nm.

9. The apparatus of claim 1, wherein said laser has a pulse length of 6 to 60 nanoseconds, with an energy fluence of 0.2–5 J/pulse.

* * * * *